United States Patent
Park et al.

[11] Patent Number: 5,871,869
[45] Date of Patent: Feb. 16, 1999

[54] PHASE SHIFTING MASK AND METHOD OF MANUFACTURING THE SAME

[75] Inventors: Chan-Min Park, Cheongju-si; Young-Kwon Jun, Seoul, both of Rep. of Korea

[73] Assignee: LG Semicon Co., Ltd., Chungcheongbuk-Do, Rep. of Korea

[21] Appl. No.: 861,938

[22] Filed: May 22, 1997

[30] Foreign Application Priority Data

Jul. 19, 1996 [KP] DPR of Korea ................. 1996 29145

[51] Int. Cl.⁶ ...................................... G03F 9/00
[52] U.S. Cl. .............................................. 430/5
[58] Field of Search .................. 430/5, 322, 323, 430/324

[56] References Cited

U.S. PATENT DOCUMENTS

| | | | |
|---|---|---|---|
| 5,429,896 | 7/1995 | Hasegawa et al. | 430/5 |
| 5,489,509 | 2/1996 | Kawabata et al. | 430/5 |
| 5,556,724 | 9/1996 | Tarumoto | 430/5 |
| 5,656,397 | 8/1997 | Imai | 430/5 |

FOREIGN PATENT DOCUMENTS 6-35169  2/1994  Japan .

OTHER PUBLICATIONS

Marc D. Levension et al., "Improving Resolution in Photolithography with a Phase–Shifting Mask", IEEE Transactions on Electron Devices, vol. Ed–29, No. 12, Dec. 1982, pp. 1828–1836.

*Primary Examiner*—S. Rosasco
*Attorney, Agent, or Firm*—Morgan, Lewis & Bockius LLP

[57] ABSTRACT

A method of manufacturing a phase shifting mask includes the steps of forming a phase shifting layer on a transparent substrate; forming an anti-deposition layer on the phase shifting layer; patterning the phase shifting layer and the anti-deposition layer; wet-etching the anti-deposition layer to expose a portion of the phase shifting layer; selectively forming a light shielding layer on the exposed portion of the phase shifting layer; and removing the anti-deposition layer.

26 Claims, 5 Drawing Sheets

PHASE SHIFTING MASK AND METHOD OF MANUFACTURING THE SAME

BACKGROUND OF THE INVENTION

1. Field of the Invention

The present invention relates to a phase shifting mask and a method of manufacturing the same, and more particularly, to a phase shifting mask and a method of manufacturing the same to be used in a photolithography process for forming fine patterns in a semiconductor device.

2. Discussion of the Related Art

As the integration and density of a semiconductor device increase, sizes of its unit elements decrease. This results in the decrease of the line-width of a conducting wire and other similar elements of the semiconductor device. Therefore, when forming a fine pattern, a photolithography process utilizing exposure methods, such as a contact printing method, a proximity printing method, and a projection printing method, has limitations. Accordingly, in order to form a fine pattern, the exposure methods need to be improved by using an electron beam or an ion beam, or a phase shifting mask needs to be utilized when the exposure is carried out.

Phase shifting mask generally includes a phase shifting region and a transmitting region. The phase of light that passes the phase shifting region is shifted by 180°, thereby causing an offset interference with light that passes the transmitting region. As a result, the resolution and the depth of the focus are improved, making it possible to obtain a good quality miniature pattern.

Phase shifting masks can be classified into alternated type, rim type, attenuated type, and outrigger type, etc. For example, a conventional alternated type phase shifting mask is disclosed in Japanese Laid-Open Patent No. 6-35169 (laid-open date: Feb. 10, 1994), entitled "A method of manufacturing a phase shifting mask".

FIGS. 1A to 1D are cross-sectional views illustrating a method of manufacturing a phase shifting mask, according to the conventional method.

Referring to FIG. 1A, an indium tin oxide (ITO) layer is deposited on a transparent substrate 11 according to a sputtering method, thereby forming a transparent conductive layer 13. A phase shifting layer 15 such as a silicon oxide layer or spin on glass (SOG) layer is formed on the transparent conductive layer 13. On the phase shifting layer 15, chrome is deposited by a sputtering method to form a light shielding layer 17. A photoresist film 18 is then coated on the light shielding layer 17.

Referring to FIG. 1B, the photoresist film 18 is exposed and developed, thereby exposing a predetermined part of the light shielding layer 17. Using the photoresist film 18 as a mask, the exposed part of the light shielding layer 17 is dry etched to expose the phase shifting layer 15. Here, the remaining light shielding layer 17 becomes a shading region.

Referring to FIG. 1C, the photoresist film 18 is removed. Then, a photoresist film 19 is coated again on the phase shifting layer 15 and the light shielding layer 17. The photoresist film 19 is exposed and developed, thereby exposing a predetermined part of the phase shifting layer 15.

Referring to FIG. 1D, using the photoresist film 19 as a mask, the exposed part of the phase shifting layer 15 is dry etched. Then, the photoresist film 19 is removed. At this time, a region where the light shielding layer 17 and the phase shifting layer 15 are removed becomes a transmitting region 14. A region where the light shielding layer 17 is removed and the phase shifting layer 15 is not removed becomes a phase shifting region 12.

However, in the conventional method of manufacturing a phase shift mask, when the phase shifting layer is etched to define the transmitting region, it is difficult to align the photoresist pattern with the transmitting region. Further, the transmitting region is defined by a photolithography method, thereby complicating the process.

SUMMARY OF THE INVENTION

Accordingly, the present invention is directed to a phase shifting mask and a method of manufacturing the same that substantially obviate one or more of the problems due to limitations and disadvantages of the related art.

An object of the present invention is to provide a phase shifting mask in which a light shielding layer is selectively formed on a phase shifting layer, thereby defining a phase shifting region when defining a shading region.

Another object of the present invention is to provide a method of manufacturing a phase shifting mask, in which a light shielding layer is selectively formed on a phase shifting layer to simultaneously define a shading region and a phase shifting region, thereby simplifying the manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a phase shifting mask of the present invention includes a transparent substrate, a phase shifting layer pattern formed on said transparent to shift a phase of incident light, and a light shielding layer selectively formed on a peripheral portion of said phase shifting layer pattern to prevent said incident light from passing said peripheral portion excluding a center portion of said phase shifting layer. In another aspect, a method of manufacturing a phase shifting mask of the present invention includes the steps of sequentially forming a phase shifting layer and an anti-deposition layer, forming the phase shifting layer and anti-deposition layer to a predetermined pattern, wet-etching the anti-deposition layer so as to be left on a predetermined part of the phase shifting layer, selectively forming a light shielding layer on the exposed part of the phase shifting layer, and removing the remaining anti-deposition layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
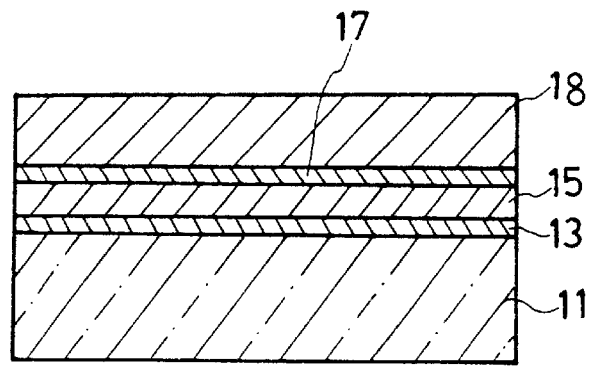
FIGS. 1A to 1D are cross-sectional views illustrating a conventional method of manufacturing a phase shifting mask.
Figure 1B:
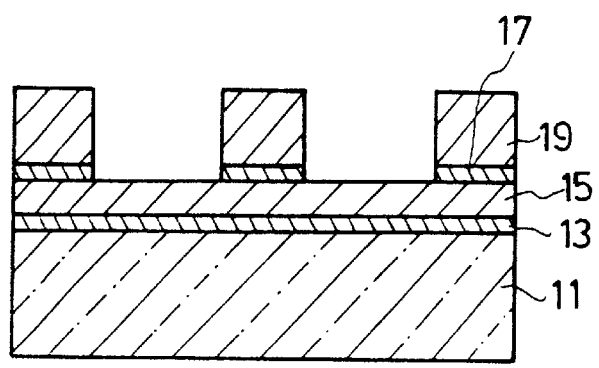
Figure 1C:
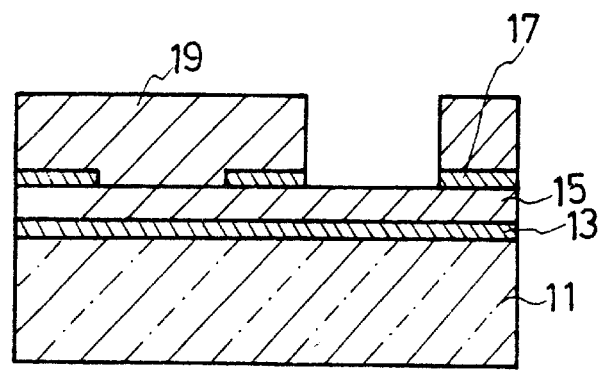
Figure 1D:
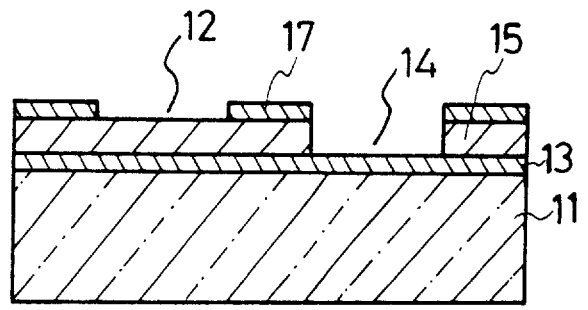
Figure 2:
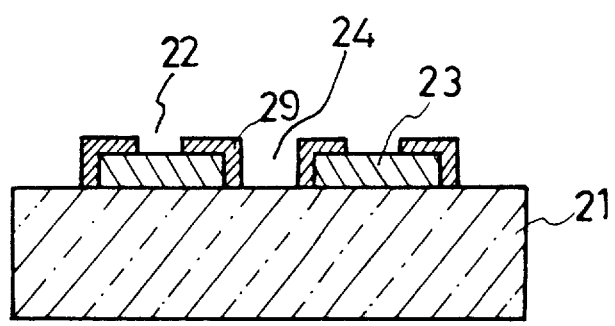
FIG. 2 is a cross-sectional view of a phase shifting mask according to the present invention.

FIG. 2 is a cross-sectional view of a phase shifting mask according to the present invention. As shown in FIG. 2, on a predetermined part of a transparent substrate 21 formed with a transparent material such as soda lime glass or quartz, phase shifting layer 23 including a metal oxide film such as $TiO_2$, $ZrO_2$, $CrO_2$ or $ZnO_2$ is formed. The phase shifting layer 23 is formed by coating the specific metal oxide film through a sol-gel method utilizing an alcoholate alcohol solution, or by depositing the specific metal oxide film through a plasma chemical vapor deposition (hereinafter, referred to as "plasma CVD") method. The phase shifting layer 23 should be formed to a predetermined thickness "t" to shift the phase of the incident light wavelength by 180°. The thickness "t" is determined by the following equation:

$$t=\lambda/\{2(n-1)\} \quad (1)$$

where "λ" is the wavelength of the incident light, and "n" is the refractive index of the phase shifting layer 23.

The refractive index "n" of the phase shifting layer 23 is about 1.6~2.3 when it is coated by the sol-gel method utilizing the alcoholate alcohol solution, and about 2.5~3.5 when it is deposited by the plasma CVD method. Accordingly, if utilizing light of I-line with a wavelength of 365 nm during exposure, the thickness of the phase shifting layer 23 is about 1400~3100 Å corresponding to the sol-gel method, and about 700~1200 Å corresponding to the plasma CVD method.

Further, on portions of the phase shifting layer 23 excluding a predetermined part, an aluminum layer (Al) is selectively deposited to a thickness of about 1000~1500 Å to form a light shielding layer 29. The light shielding layer 29 is formed by the following method. A dimethylaluminumhydride (DMAH) layer is deposited on the phase shifting layer 23 through reaction with oxalic acid (OH) radicals contained in the surface and inside of the phase shifting layer 23. Then, methyl group and OH group evaporate from the deposited DMAH layer so that the remaining aluminum constitutes a thin film to thereby form the light shielding layer 29. Further, the light shielding layer 29 is formed only on a predetermined part of the surface of the phase shifting layer 23. It may also be formed along the side as well as on the surface of the phase shifting layer 23. The part of the transparent substrate 21 where the phase shifting layer 23 is not formed becomes a transmitting region 24. The part where the light shielding layer 29 is not formed on the phase shifting layer 23 becomes a phase shifting region 22. The part where light shielding layer 29 is formed becomes a shading region.

FIGS. 3A to 3D are cross-sectional views illustrating a method of manufacturing a phase shifting mask, according to a first embodiment of the present invention.

Figure 3A:
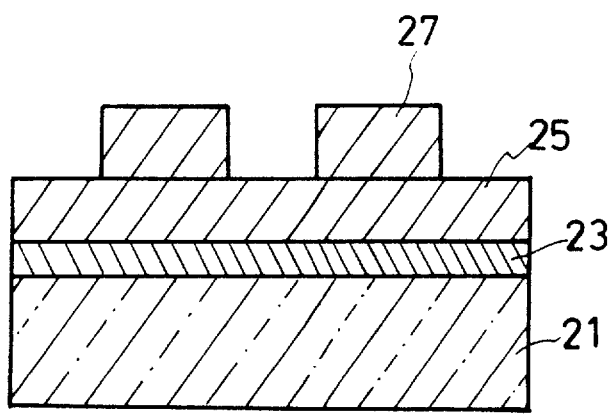
FIGS. 3A to 3D are cross-sectional views illustrating a method of manufacturing a phase shifting mask according to a first embodiment of the present invention.

Referring to FIG. 3A, on a transparent substrate 21 formed with a transparent material such as soda lime glass or quartz, phase shifting layer 23 including a metal oxide film such as $TiO_2$, $ZrO_2$, $CrO_2$ or $ZnO_2$ is formed. The phase shifting layer 23 is formed by coating the specific metal oxide film through a sol-gel method utilizing an alcoholate alcohol solution, or by depositing the specific metal oxide film through a plasma CVD method. The thickness of the phase shifting layer 23 is determined by equation (1) to shift the phase of the incident light wavelength by 180°. The refractive index "n" of the phase shifting layer 23 is about 1.6~2.3 when it is coated by the sol-gel method utilizing the alcoholate alcohol solution, and about 2.5~3.5 when it is deposited by the plasma CVD method. Accordingly, when utilizing light of I-line with a wavelength of 365 nm during exposure, the phase shifting layer 23 is formed to a thickness of about 1400~3100 Å corresponding to the sol-gel method, and about 700~1200 Å corresponding to the plasma CVD method.

Then, on the phase shifting layer 23, a material with a large etch selectivity to the material constituting the phase shifting layer 23, e.g., silicon nitride (SixNy), silicon oxide (SixOy) or spin on glass (SOG), is deposited to a thickness of about 4500~5000 Å so that its width is larger than the width of a pattern to be formed by a CVD method, thereby forming an anti-deposition layer 25. Then, after coating a photoresist film 27 on the anti-deposition layer 25, the photoresist film 27 is exposed and developed to expose a predetermined part of the anti-deposition layer 25.

Figure 3B:
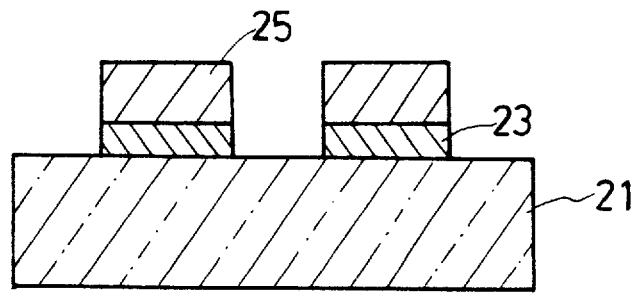

Referring to FIG. 3B, using the photoresist film 27 as a mask, the anti-deposition layer 25 and the phase shifting layer 23 are sequentially etched by an anisotropic etching method such as a reactive ion etching (hereinafter, referred to as "RIE") method, thereby exposing portions of the transparent substrate 21. Alternatively, the anti-deposition layer 25 is wet etched, and the phase shifting layer 23 is etched by the anisotropic etching method. In other words, the anti-deposition layer 25 may be wet etched using an etching solution with a large etch selectivity to the phase shifting layer 23, e.g., a phosphoric acid ($H_3PO_4$) solution. Then, the phase shifting layer 23 may be anisotropically etched by the RIE method. Thereafter, the photoresist film 27 is removed.

Figure 3C:
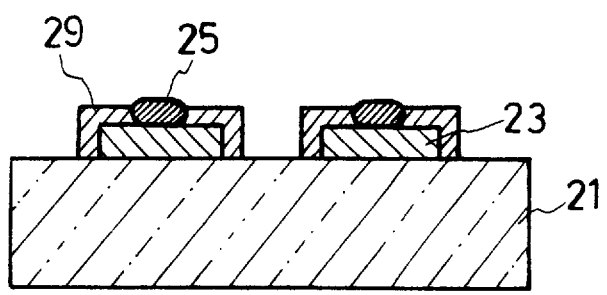

Referring to FIG. 3C, using an etching solution such as the phosphoric acid ($H_3PO_4$) solution, the anti-deposition layer 25 is etched without an additional mask until its thickness is about 1000~1500 Å, thereby exposing portions of the phase shifting layer 23. At this time, the anti-deposition layer 25 is etched isotropically, so that the widths of the exposed portions of the phase shifting layer 23 become identical at both sides. Furthermore, since the phase shifting layer 23 has a large etch selectivity compared to the anti-deposition layer 25, it is not etched.

Then, aluminum (Al) is selectively deposited on the exposed portions of the phase shifting layer 23 to form a light shielding layer 29. In other words, on the transparent substrate 21, the phase shifting layer 23 and anti-deposition layer 25, dimethylaluminumhydride (DMAH) is deposited at a low temperature of about 100°~230° C. and a pressure of about 500 Torr or below. Because of the special reactions between DMAH and the phase shifting layer 23, DMAH is deposited only on the phase shifting layer 23, not on the transparent substrate 21 and the anti-deposition layer 25. More specifically, because a great deal of oxalic acid (OH) radicals is contained in the surface and inside of the metal oxide constituting the phase shifting layer 23, the OH radicals react with DMAH as in the following equation:

$$M—OH+Al(CH_3)_2H \rightarrow M—OAL(CH_3)_2+H2 \quad (2)$$

where M is the metal oxide constituting the phase shifting layer 23. The OH radicals react chemically with DMAH, so that DMAH is deposited on the phase shifting layer 23 easily. On the contrary, since the transparent substrate 21 and the anti-deposition layer 25 do not contain the OH radicals, they do not chemically react with DMAH. Thus, DMAH is not deposited on the transparent substrate 21 and the anti-deposition layer 25. Further, when depositing DMAH, in order to prevent the transparent substrate 21 from being dissolved due to chemical reaction with the deposited DMAH, a low temperature of about 100°~230° C. for the deposition of DMAH is required.

An aluminum thin film is formed due to the vaporization from the DMAH deposited on the phase shifting layer 23. This aluminum thin film is selectively formed on the surface of the phase shifting layer 23. At this time, it is preferable that the thickness of the remaining anti-deposition layer 25 becomes about 1000~1500 Å.

Figure 3D:
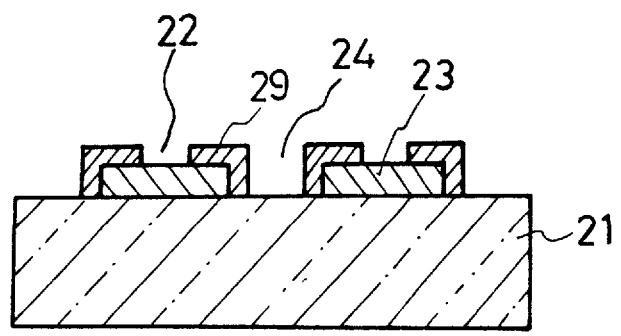

Referring to FIG. 3D, the anti-deposition layer 25 on the phase shifting layer 23 is removed, and the part where no light shielding layer 29 is formed is defined as a phase shifting region 22. The part where the light shielding layer 29 is formed is defined as a shading region. The part of the transparent substrate 21 where the phase shifting layer is not formed becomes a transmitting region 24.

FIGS. 4A to 4E are cross-sectional views illustrating a method of manufacturing a phase shifting mask, according to a second embodiment of the present invention.

Figure 4A:
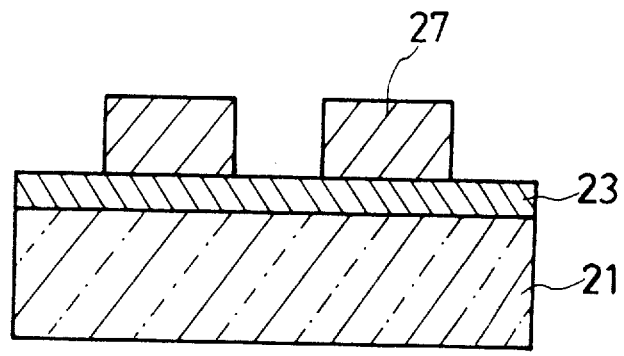
FIGS. 4A to 4E are cross-sectional views illustrating a method of manufacturing a phase shifting mask according to a second embodiment of the present invention.

Referring to FIG. 4A, on a transparent substrate 21 formed with a transparent material such as soda lime glass or quartz, phase shifting layer 23 including a metal oxide film such as $TiO_2$, $ZrO_2$, $CrO_2$ or $ZnO_2$ is formed. The phase shifting layer 23 is formed by coating the specific metal oxide film through a sol-gel method utilizing an alcoholate alcohol solution, or by depositing the specific metal oxide film through a plasma CVD method. The phase shifting layer 23 is used to shift the phase of the incident light wavelength by 180°. If utilizing light of I-line with a wavelength of 365 nm during exposure, the phase shifting layer 23 is formed to a thickness of about 1400~3100 Å corresponding to the sol-gel method, and about 700~1200 Å corresponding to the plasma CVD method, according equation (1).

Then, after coating a photoresist film 27 on the phase shifting layer 23, it is exposed and developed to expose a predetermined part of the phase shifting layer 23.

Figure 4B:
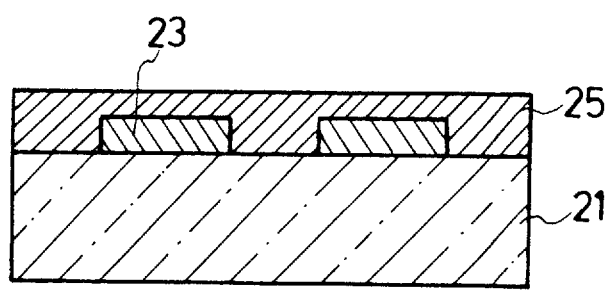

Referring to FIG. 4B, using the photoresist film 27 as a mask, the phase shifting layer 23 is etched by an anisotropic etching method such as a RIE method, thereby exposing portions of the transparent substrate 21. Then, after removing the photoresist film 27, a material with a large etch selectivity to the material constituting phase shifting layer 23, e.g., silicon nitride (SixNy), silicon oxide (SixOy) or spin on glass (SOG), is deposited above the transparent substrate 21 and the phase shifting layer 23 to a thickness of about 1000~1500 Å by a CVD method, thereby forming an anti-deposition layer 25.

Figure 4C:
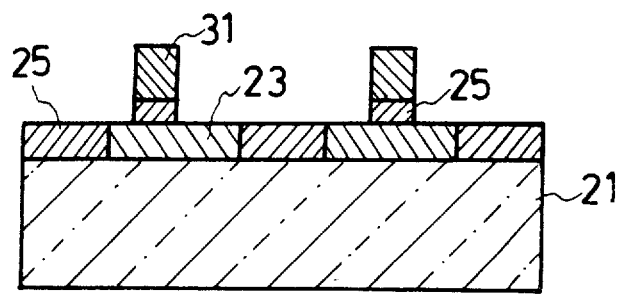

Referring to FIG. 4C, a photoresist film 31 is coated on the anti-deposition layer 25. Then, the photoresist film 31 is exposed and developed to be left only on a predetermined part above the phase shifting layer 23, thereby exposing the anti-deposition layer 25. Using the photoresist film 31 as a mask, the exposed part of the anti-deposition layer 25 is etched by an anisotropic etching method such as RIE, thereby exposing portions of the phase shifting layer 23. At this time, since the phase shifting layer 23 has a large etch selectivity to the anti-deposition layer 25, it serves as an anti-etching layer. Further, since the widths of the exposed portions of anti-deposition layer 25 can be controlled, the width of the mask pattern and the distance between the patterns can be formed to be not uniform. Alternatively, the anti-deposition layer 25 is removed to expose the transparent substrate 21, so that the sides of the phase shifting layer 23 are exposed as well as its top surface. Here, the anti-deposition layer 25 can be removed by a wet etching utilizing an etching solution such as a phosphoric acid ($H_3PO_4$) solution, or a dry etching method such as RIE.

Figure 4D:
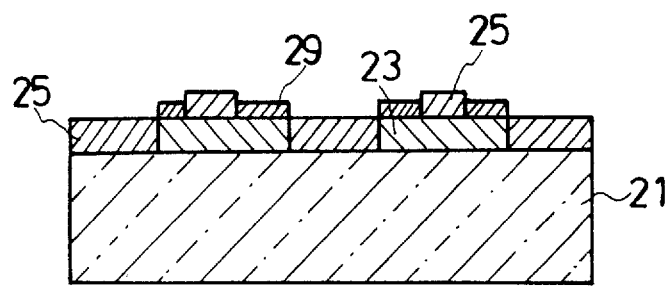

Referring to FIG. 4D, after removing the photoresist film 31, aluminum (Al) is selectively deposited to a thickness of about 1000~1500 Å on a predetermined portion of the phase shifting layer 23, thereby forming a light shielding layer 29. In other words, at a low temperature of about 100°~230° C. and a pressure of about 500 Torr or below, DMAH is deposited on the transparent substrate 21 (if exposed), the phase shifting layer 23 and the anti-deposition layer 25. As explained above, DMAH is adsorbed only on the phase shifting layer 23 containing a great deal of OH radicals. A light shielding layer 29 is formed after vaporization from the adsorbed DMAH, leaving an aluminum film on the phase shifting layer 23. Since the transparent substrate 21 and the anti-deposition layer 25 do not contain OH radicals, the DMAH is not adsorbed thereon. Thus, the light shielding layer 29 is formed only on the phase shifting layer 23. Further, when depositing DMAH, in order to prevent the transparent substrate 21 from being dissolved due to the chemical reaction with the deposited DMAH, a low temperature of about 100°~230° C. for the deposition of DMAH is required.

Figure 4E:
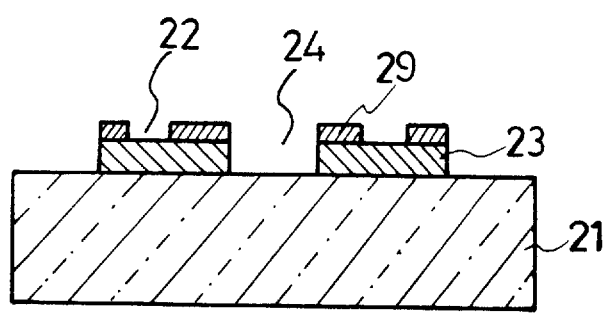

Referring to FIG. 4E, the anti-deposition layer 25 remaining on the transparent substrate 21 and the phase shifting layer 23 is removed using an etching solution such as a phosphoric acid ($H_3PO_4$) solution. As a result, the part where no light shielding layer 29 is formed is defined as a phase shifting region 22. The part where the light shielding layer 29 is formed is defined as a shading region. The part of the transparent substrate 21 where the phase shifting layer is not formed becomes a transmitting region 24.

According to the present invention, the anti-deposition layer is wet etched to be left only on the predetermined part of the phase shifting layer, and DMAH is then deposited. As a result, DMAH reacts chemically with the OH radicals contained in the phase shifting layer to be selectively deposited only on the exposed part of the phase shifting layer. Then, the gas in the deposited DMAH is vaporized to form the light shielding layer.

Accordingly, the present invention selectively forms the light shielding layer on the phase shifting layer, so that the shading region and the phase shifting region can be defined at the same time. This greatly simplifies the manufacturing process.

It will be apparent to those skilled in the art that various modifications and variations can be made in the phase shifting mask and the method of manufacturing the same of the present invention without departing from the spirit or scope of the invention. Thus, it is intended that the present invention cover the modifications and variations of this invention provided they come within the scope of the appended claims and their equivalents.

What is claimed is:

1. A phase shifting mask comprising:
   a transparent substrate;
   a phase shifting layer pattern formed directly on the transparent substrate to shift a phase of incident light, the phase shifting layer pattern including a metal oxide film; and
   a light shielding layer selectively formed on a peripheral portion of the phase shifting layer pattern to prevent the incident light from passing through the peripheral portion of the phase shifting layer pattern, wherein the phase shifting layer pattern is interposed between the light shielding layer and the substrate.

2. The phase shifting mask as claimed in claim 1, wherein the metal oxide film of the phase shifting layer pattern includes one of $TiO_2$, $ZrO_2$, $CrO_2$ and $ZnO_2$.

3. The phase shifting mask as claimed in claim 1, wherein a thickness (t) of the phase shifting layer pattern is defined by $t=\lambda/\{2(n-1)\}$, with $\lambda$ being a wavelength of the incident light and n being a refractive index of the phase shifting layer pattern.

4. The phase shifting mask as claimed in claim 1, wherein the phase shifting layer pattern is formed by coating the metal oxide film using an alcoholate alcohol solution through a sol-gel method.

5. The phase shifting mask as claimed in claim 1, wherein the phase shifting layer pattern is formed by a plasma chemical vapor deposition method.

6. The phase shifting mask as claimed in claim 1, wherein the phase shifting layer pattern is formed to a thickness of about 1400~3100 Å if formed through a sol-gel method, and to a thickness of about 700~1200 Å if formed with a plasma chemical vapor deposition method.

7. The phase shifting mask as claimed in claim 1, wherein the light shielding layer includes an aluminum thin film.

8. The phase shifting mask as claimed in claim 1, wherein portions of the light shielding layer are also formed on sides of the phase shifting layer pattern.

9. The phase shifting mask as claimed in claim 1, wherein the light shielding layer is formed to a thickness of about 1000~1500 Å.

10. A method of manufacturing a phase shifting mask comprising the steps of:

forming a phase shifting layer directly on a transparent substrate;

forming an anti-deposition layer on the phase shifting layer;

patterning the phase shifting layer and the anti-deposition layer;

wet-etching the anti-deposition layer to expose a portion of the phase shifting layer;

selectively forming a light shielding layer on the exposed portion of the phase shifting layer, wherein the phase shifting layer is interposed between the light shielding layer and the substrate; and removing the anti-deposition layer.

11. The method as claimed in claim 10, wherein the phase shifting layer is formed with a metal oxide film.

12. The method as claimed in claim 11, wherein a thickness (t) of the phase shifting layer is defined by $t=\lambda/\{2(n-1)\}$, with $\lambda$ being a wavelength of the incident light and n being a refractive index of the phase shifting layer.

13. The method as claimed in claim 12, wherein the anti-deposition layer includes a material selected from the group of silicon nitride (SixNy), silicon oxide (SixOy) and spin on glass (SOG).

14. The method as claimed in claim 13, wherein the anti-deposition layer is formed to a thickness of about 4500~5000 Å.

15. The method as claimed in claim 11, wherein the phase shifting layer is formed through a sol-gel method utilizing an alcoholate alcohol solution.

16. The method as claimed in claim 11, wherein the phase shifting layer is formed by a plasma chemical vapor deposition method.

17. The method as claimed in claim 11, wherein the phase shifting layer is formed to a thickness of about 1400~3100 Å if formed through a sol-gel method, and to a thickness of about 700~1200 Å if formed with a plasma chemical vapor deposition method.

18. The method as claimed in claim 10, wherein the phase shifting layer includes one of $TiO_2$, $ZrO_2$, $CrO_2$ and $ZnO_2$.

19. The method as claimed in claim 10, wherein the step of forming the light shielding layer includes depositing dimethylaluminumhydride (DMAH) on the transparent substrate, the phase shifting layer and the anti-deposition layer so that DMAH chemically reacts with OH radicals contained in the phase shifting layer, thereby selectively forming an aluminum thin film only on the exposed portion of the phase shifting layer.

20. The method as claimed in claim 19, wherein the step of depositing DMAH is performed at a temperature of about 100°~230° C. and a pressure of about 500 Torr and below.

21. The method of manufacturing a phase shifting layer as claimed in claim 10, wherein the light shielding layer is formed to a thickness of about 1000~1500 Å.

22. A method of manufacturing a phase shifting mask comprising the steps of:

forming a phase shifting layer pattern directly on a transparent substrate;

forming an anti-deposition layer on the transparent substrate and the phase shifting layer pattern;

etching the anti-deposition layer to expose a portion of the phase shifting layer;

selectively forming a light shielding layer on the exposed portion of the phase shifting layer pattern, wherein the phase shifting layer is interposed between the light shielding layer and the substrate; and removing the anti-deposition layer.

23. The method as claimed in claim 22, wherein the anti-deposition layer includes a material selected from the group of silicon nitride (SixNy), silicon oxide (SixOy) and spin on glass (SOG).

24. The method as claimed in claim 22, wherein the anti-deposition layer is formed to a thickness of about 4500~5000 Å.

25. The method as claimed in claim 22, wherein the step of etching the anti-deposition layer includes a dry etch process.

26. The method as claimed in claim 22, wherein the step of etching the anti-deposition layer includes a wet etch process.

* * * * *